United States Patent
Pullela et al.

(10) Patent No.: US 8,838,057 B2
(45) Date of Patent: Sep. 16, 2014

(54) HARMONIC REJECTION MIXER ARCHITECTURE WITH REDUCED SENSITIVITY TO GAIN AND PHASE MISMATCHES

(75) Inventors: Raja Pullela, Carlsbad, CA (US); Vamsi Paidi, Carlsbad, CA (US); Rahul Bhatia, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 446 days.

(21) Appl. No.: 13/331,792

(22) Filed: Dec. 20, 2011

(65) Prior Publication Data

US 2012/0322398 A1  Dec. 20, 2012

Related U.S. Application Data

(60) Provisional application No. 61/471,567, filed on Apr. 4, 2011.

(51) Int. Cl.
*H04B 1/10* (2006.01)
*H03D 7/16* (2006.01)
*H03D 7/14* (2006.01)

(52) U.S. Cl.
CPC ............. *H03D 7/1466* (2013.01); *H03D 7/166* (2013.01); *H03D 2200/0086* (2013.01)
USPC ............ 455/302; 455/313; 455/318; 455/323

(58) Field of Classification Search
CPC ... H03D 7/1458; H03D 7/1441; H03D 7/165; H03D 7/1433; H03D 2200/0084; H03D 7/1491

USPC .......................................................... 455/302
See application file for complete search history.

(56) References Cited

U.S. PATENT DOCUMENTS

2006/0166637 A1* 7/2006 Lore et al. ...................... 455/313
2007/0243847 A1* 10/2007 Shen .............................. 455/318
2008/0132193 A1* 6/2008 Petrovic et al. ............... 455/323

\* cited by examiner

*Primary Examiner* — Ajibola Akinyemi
(74) *Attorney, Agent, or Firm* — Kilpatrick Townsend & Stockton LLP

(57) ABSTRACT

A harmonic rejection mixer includes a first scaling circuit for scaling an RF signal to generate a plurality of scaled RF signals, a first switching stage for sampling the scaled RF signals using a first plurality of switching signals, and a second mixing stage for mixing the sampled RF signals with a second plurality of switching signals to generate a plurality of frequency translated signals having different phases. A combiner adds the frequency translated signals together to generate a first plurality of baseband versions of the RF signal. A first amplifier stage processes the first plurality of baseband versions to generate a second plurality of baseband versions. The mixer further includes a second scaling circuit for scaling the second plurality of baseband versions and a second amplifier stage to generate an in-phase baseband signal and a quadrature baseband signal from the scaled second plurality of baseband versions.

28 Claims, 11 Drawing Sheets

HARMONIC REJECTION MIXER ARCHITECTURE WITH REDUCED SENSITIVITY TO GAIN AND PHASE MISMATCHES

CROSS-REFERENCE TO RELATED APPLICATIONS

The present application claims benefit under 35 USC 119 (e) of U.S. provisional application No. 61/471,567, filed Apr. 4, 2011, entitled "Harmonic Rejection Mixer Architecture with Reduced Sensitivity to Gain and Phase Mismatches", the content of which is incorporated herein by reference in its entirety.

BACKGROUND OF THE INVENTION

Embodiments of the present invention relate to the radio frequency (RF) receivers, and more particularly, to RF mixers.

Mixers used in receivers today typically down-convert signals from various harmonics of a local oscillator frequency (LO) due to the square wave LO used in these implementations. Although the square wave LO results in better noise and linearity compared to a sinusoidal LO, the RF signal at harmonics of the square wave alias into the desired signal band at the output of the mixer. This is a major problem in broad-band systems such as TV tuners or cable-systems, where the input signal range is wide-band.

Harmonic reject mixers have been developed to eliminate the signal down-converted from higher harmonics. They achieve this by using multiple mixing blocks (alternatively referred to and shown herein as a switch) as shown in FIG. 1. Each switch 10 of FIG. 1 is clocked with a different phase of the LO. The mixing block outputs are weighted and summed so as to create an effective LO mixing waveform that is more sinusoidal than square. The harmonics of the RF signal that are rejected depend on the number of mixing blocks, or number of "samples of the RF output". For example a 2N-tap harmonic rejection topology, realized using N differential mixing blocks, eliminates all harmonics except those at $(m*2N)-1$ and $(m*2N)+1$, where m is an integer. Implementation of the 2N tap harmonic reject mixer 20 is shown in FIG. 1. The LO waveforms shown in FIG. 1 are for N=8. This is a specific example of harmonic rejection topology where cancellation of harmonics is done in the base-band after summation of various base-band taps. The base-band outputs are summed with the corresponding weighting factors to generate quadrature signals.

FIG. 2 is a block diagram of a harmonic reject mixer 20 for which N=4, as known in the prior art. Harmonic reject mixer 20 eliminates $3^{rd}$ and $5^{th}$ harmonics of the RF signal. Harmonic reject mixer 20 is shown as including eight switches 10. The output signals of the base-band amplifiers 12 are converted to currents by resistors 14 whose resistances represent weights or coefficients applied to the output signals of amplifiers 12. The output currents of resistors 14 are subsequently summed by amplifiers 16. As shown, weighted phases 0, 45 and 90 are added by adder 16 to generate the In-phase OUT_I component of the output signal, and weighted phases 45, 90 and 135 are added by adder 18 to generate the quadrature-phase OUT_Q component of the output signal.

In conventional reject mixers each sample of the received RF signal is defined by a separate switch and is hence susceptible to phase and duty cycle mismatches in the switches or the LO path. Phase and gain errors through the different taps limit the ultimate rejection achievable from the topology. Imperfections in the LO generation and mixing blocks result in a phase offset and duty cycle error. Phase errors result in imperfect cancellation of harmonics at the summing node. Duty cycle errors result in amplitude mismatch that also limits the harmonic rejection.

Impact of gain errors can be minimized by using a conventional dual harmonic reject architecture. In such an architecture, outputs of multiple number of harmonic reject mixers that are phase shifted with respect to one another are weighted and combined to get the second layer of harmonic rejection. Minimizing phase and duty cycle errors without taking care of gain errors or vice versa limits the improvement in harmonic rejection that can be achieved.

Accordingly, it would be beneficial to provide a harmonic rejection mixer with reduced sensitivity to gain and phase mismatches.

BRIEF SUMMARY OF THE INVENTION

Embodiments of the present invention provide devices, systems, and methods for minimizing phase and duty cycle errors using a mixer that includes two switching stages. The switches in the first switching stage switch at a higher rate of N times the LO frequency, where N is an integer. The second switching stage includes N switches each of which is controlled by one of the N phases of the non-overlapping LO phases. The N phases of the LO of the second switching stage are aligned to the N*LO signal. Accordingly, the RF signal sampled at the output of each switch of the second switching stage is dependent only on the N*LO switches (symbol * represents multiplication operation). The other switches simply guide the sample to the appropriate output.

The present invention discloses a radio frequency mixer for translating a frequency of an RF input signal to a baseband frequency while rejecting harmonics. The mixer includes a first switching stage configured to sample the RF input signal to generate a plurality of sampled RF signals in response to a first plurality of switching signals and a second switching stage configured to mix the sampled RF signals with a second plurality of switching signals to generate a plurality of frequency translated output signals in response to a second plurality of switching signals. The first switching stage may include one or more switches connected in parallel that are turned on and off in response to the first plurality of switching signals. The second switching stage may include multiple switches that are connected in parallel, and each of the multiple switches may function as a mixer to frequency translate the sampled RF signals to corresponding baseband signals using the second plurality of switch signals, wherein each of the second plurality of switching signals is a phase-shifted version of a local oscillator signal, and wherein the first plurality of switching signals includes a frequency that is N times higher than the local oscillator frequency. In an embodiment, the first plurality of switching signals includes a differential switching signal having a direct switching signal and an inverted switching signal, the direct and inverted switching signals do not overlap. The first switching stage includes a first switch and a second switch, the first and second switches are controlled by the respective direct and inverted switching signals. The mixer further includes a scaling circuit configured to scale the frequency translated signals using a plurality of weighting factors and a combiner configured to sum the weighted signals together to generate an in-phase baseband signal component and a quadrature baseband signal component.

The present invention also discloses a harmonic rejection mixer that includes a first scaling circuit having a plurality of weighting factors and configured to scale an amplitude of an RF signal to generate a plurality of weighted RF signals using the weighting factors, a first switching stage configured to sample the plurality of weighted RF signals for generating a plurality of sampled RF signals in response to a first plurality of switching signals, and a second mixing stage configured to mix the sampled RF signals for generating a plurality of frequency translated output signals in response to a second plurality of switching signals. The harmonic rejection mixer further includes a combiner configured to combine the frequency translated output signals to generate a first plurality of baseband versions of the RF signal that is free of all harmonics except for the (m*2N−1) and (m*2N+1) harmonics, where m is an integer. The harmonic rejection mixer additionally includes a first amplifier stage having a plurality of amplifiers coupled to the first plurality of baseband versions of the RF signal and configured to generate a second plurality of baseband versions. The harmonic rejection mixer further includes a second scaling circuit for scaling the second plurality of baseband versions and a second amplifier stage configured to generate an in-phase baseband signal and a quadrature baseband signal. The second amplifier stage recombine the scaled second plurality of baseband versions to provide additional rejection for all harmonics except for (m*2Y−1) and (m*2Y+1), where m is an integer and Y is the number of amplifiers in the first amplifier stage. In an embodiment, the second amplifier stage may operate in the current domain. In another embodiment, the second amplifier stage may operate in the voltage domain.

The present invention also discloses a method of down-converting an RF signal that includes sampling the RF signal using a first plurality of switching signals to produce a plurality of sampled RF signals and mixing the sampled RF signals with a second plurality of switching signals to generate a plurality of frequency translated output signals. In an embodiment, each one of the sampled RF signals is mixed with a different one of the second plurality of switching signals, wherein each one of the second plurality of switch signals is a phase-shifted version of a local oscillator signal, and the first plurality of switch signals has a frequency that is N times higher that the frequency of the local oscillator signal, wherein N is an integer greater than unity. The method further includes scaling each one of the frequency translated output signals with a weighting factor that is associated with each of the second plurality of switching signals. The method further includes combining the weighted frequency translated output signals to generate an in-phase baseband signal and a quadrature baseband signal.

The present invention also includes an alternative method of down-converting a voltage-domain RF signal having a RF signal frequency. The method includes converting the voltage-domain RF signal to a current-domain RF signal using a trans-conductance amplifier having a Gm gain. The method further includes scaling the current-domain RF signal using a plurality of resistive elements connected in parallel to generate a plurality of weighted RF signals, wherein each resistive element corresponds to a weighting value. The method also includes sampling the plurality of weighted RF signals with a first plurality of switching signals to generate a plurality of sampled RF signals, mixing the sampled and weighted RF signals with a second plurality of switching signals to generate a plurality of frequency translated signals, and combining the frequency translated signals to generate an in-phase baseband signal and a quadrature baseband signal. In an embodiment, the first plurality of first switching signals has a frequency at least 8 times higher than the RF signal frequency, and the second plurality of switching frequency includes phase shifted versions of a local oscillator (LO) frequency that is in the range of the RF signal frequency.

The present invention also discloses a method of down-converting an RF signal that includes scaling the RF signal using a first plurality of weighting factors to generate a plurality of weighted RF signals, sampling the weighted RF signals with a first plurality of switching signals to generate a plurality of sampled and weighted RF signals, and mixing the sampled and weighted RF signals with a second plurality of switching signals to generate a plurality of frequency translated output signals, wherein the second plurality of switch signals includes multiple phase-shifted versions of a local oscillator signal that has a frequency in the range of the RF signal frequency, and the first plurality of switching signals has a frequency that is N times higher than the local oscillator signal frequency, where N is an integer greater than unity. The method further includes combining the frequency translated output signals to generate multiple first baseband versions of the RF signal. The method also includes converting the first baseband versions of the RF signal into a plurality of second baseband versions, weighting the second baseband versions with a second plurality of weighting factors to generate a second plurality of weighted baseband versions, and combining the second plurality of weighted baseband versions to generate an in-phase baseband signal and a quadrature baseband signal.

Various features and advantages of the invention can be more fully appreciated with reference to the detailed description and accompanying drawings that follow.

BRIEF DESCRIPTION OF THE DRAWINGS

The features and advantages of embodiments of the present invention will become more apparent from the detailed description set forth below when taken in conjunction with the drawings, in which like elements bear like reference numerals.

DETAILED DESCRIPTION OF THE INVENTION

In accordance with embodiments of the present invention, both gain errors and phase and duty cycle errors are minimized to improve harmonic rejection beyond what can be achieved by minimizing gain and phase errors in isolation. A harmonic reject mixer in accordance with the present invention is implemented as a bank of mixers that include at least two switching stages (also referred to herein as mixing stages). Phase and duty cycle errors are minimized by using a mixer that includes at least 2 switching stages. The switches in the first switching stage switch at a higher rate of N times the LO frequency, where N is an integer. The second switching stage includes N switches each of which is controlled by one of the N phases of the non-overlapping LO phases. The N phases of the LO of the second switching stage are aligned to the N*LO signal. Accordingly, the RF signal sampled at the output of each switch of the second switching stage is dependent only on the N*LO switches (symbol * represents multiplication operation). The other switches simply guide the sample to the appropriate output. The two-switching stage configuration minimizes phase and duty cycle errors and eliminates all harmonics except for those at (m*2N)±1, where m is an integer.

Figures 1A, 1B:
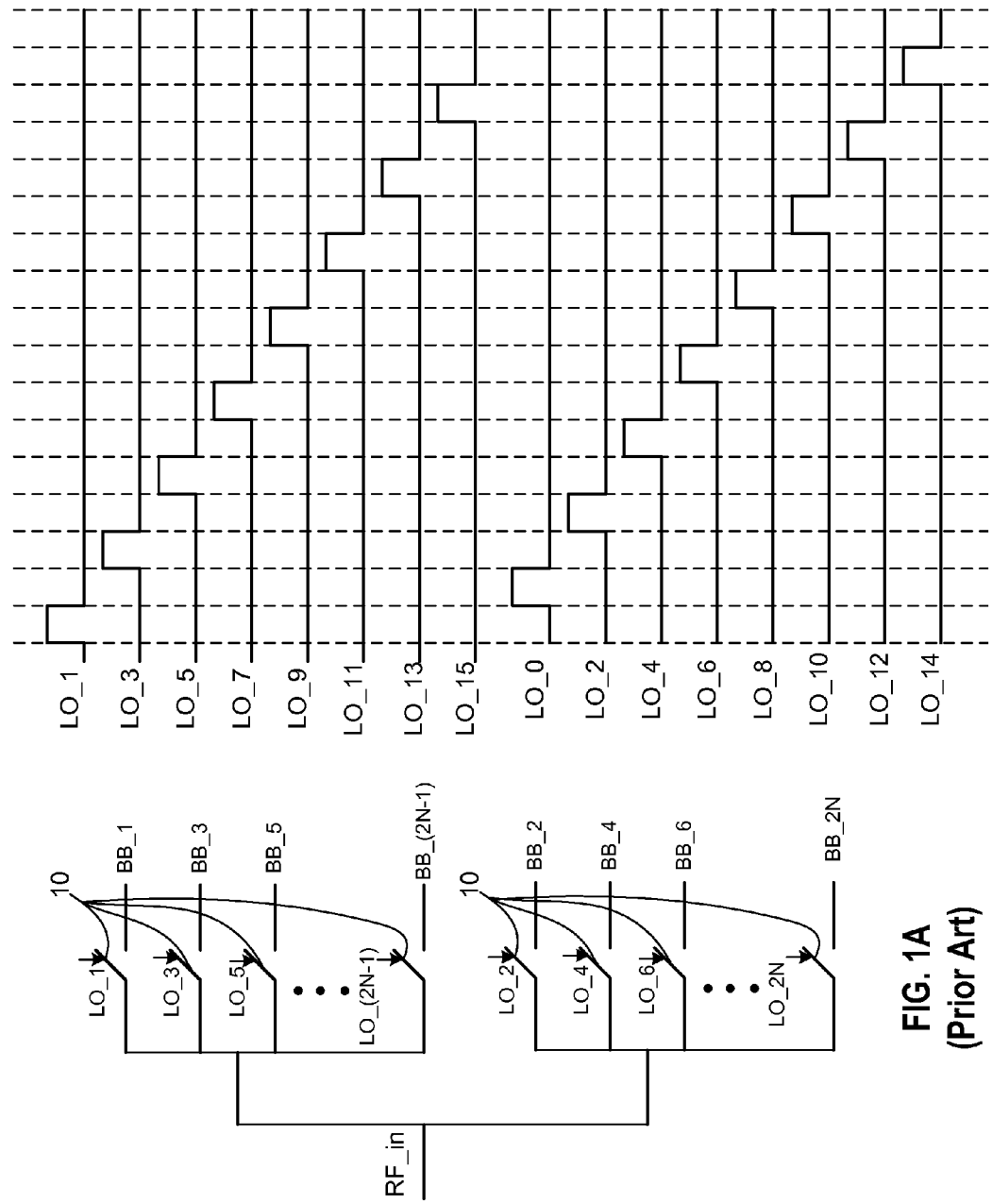
FIG. 1A is a simplified schematic diagram of a harmonic rejection mixer, as known in the prior art.
FIG. 1B is a timing diagram of the LO signals used in FIG. 1.
Figure 2:
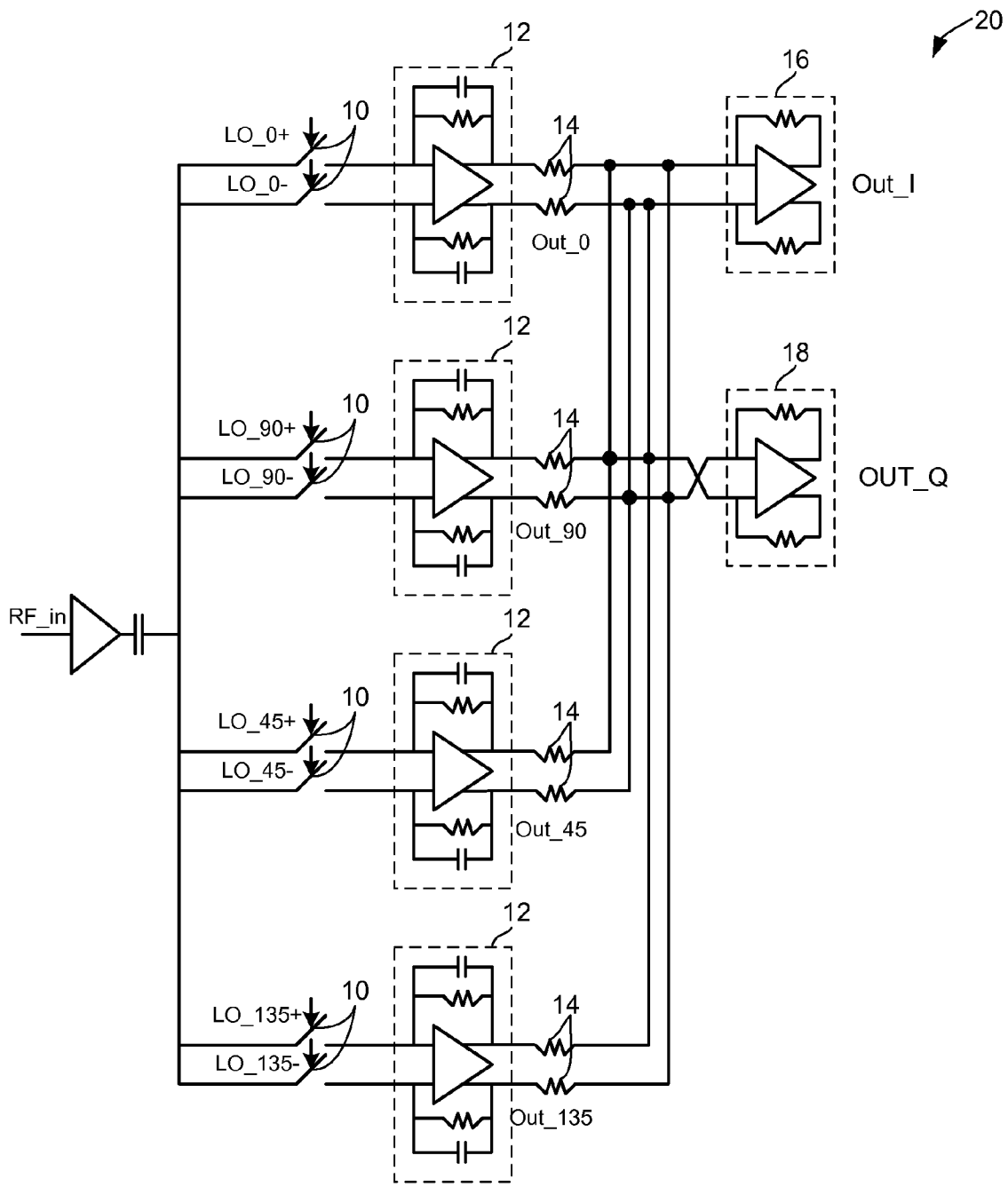
FIG. 2 is a simplified schematic diagram of another harmonic rejection mixer, as known in the prior art.
Figure 3A:
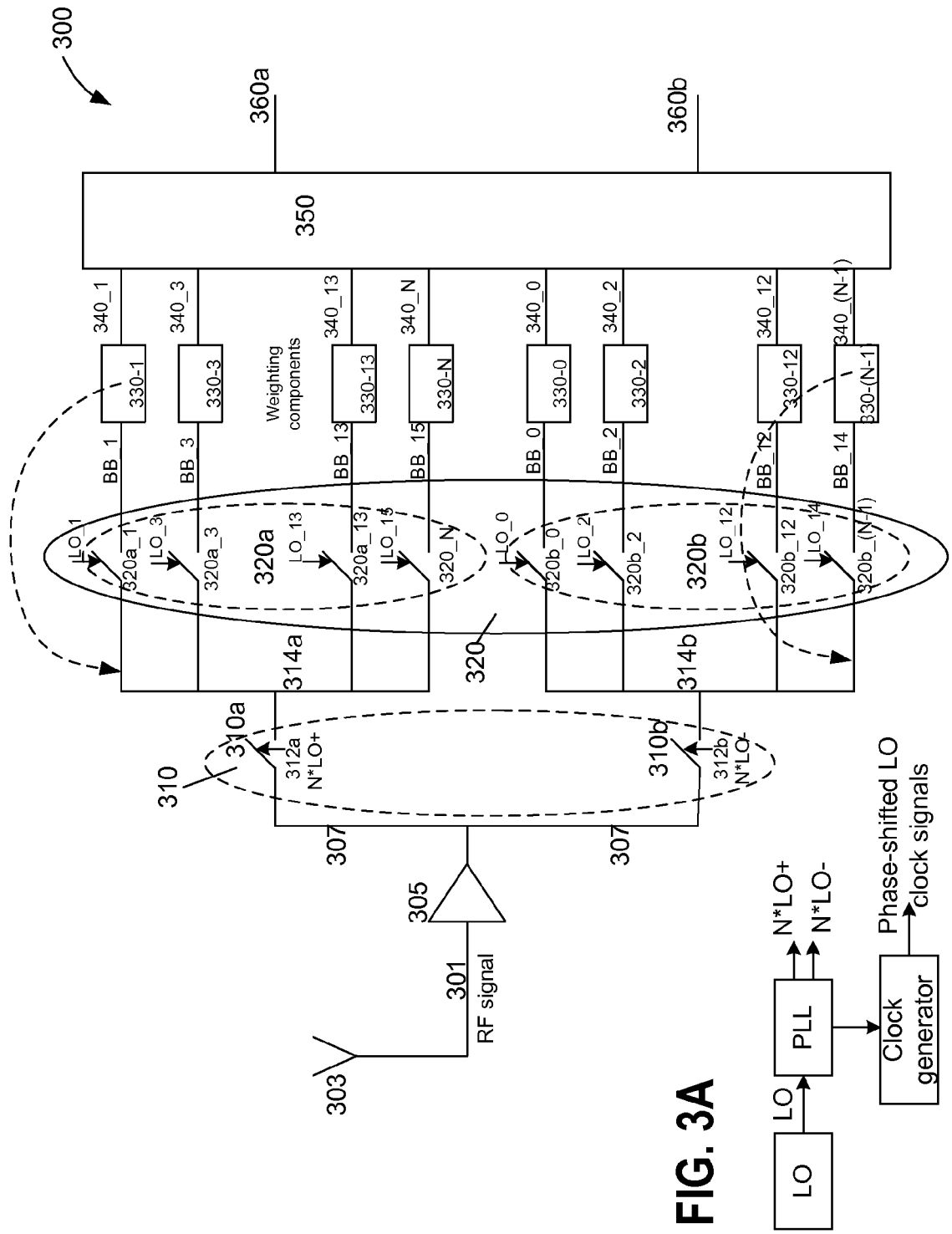
FIG. 3A is a schematic block diagram of a harmonic rejection mixer according to an embodiment of the present invention.

FIG. 3A is a simplified schematic diagram of a harmonic rejection mixer 300 according to an embodiment of the present invention. In the embodiment shown in FIG. 3, the RF mixer 300 includes, in part, an RF input coupled to an antenna 303 for receiving an RF signal 301. A low noise amplifier 305 amplifies the RF input signal and provides an amplified amplitude 307 of the RF input signal to a first switching stage 310. In an embodiment, amplifier 305 can be a low-noise voltage amplifier. In another embodiment, amplifier 305 can have a Gm gain. First switching stage 310 includes a first switch 310a and a second switch 310b that sample the amplified RF signal 307 with a clock signal 312a and a clock signal 312b, respectively. Clock signals 312a and 312b may include a frequency of N×LO, where N is an integer corresponding to a number of switches in a second switching stage (discussed below), and LO is an output frequency of a local oscillator (LO). In various embodiments, the local oscillator may include a voltage controlled oscillator (VCO) in the RF mixer 300. Clock signals 312a and 312b may be generated by a phase locked loop (PLL) circuit that multiplies the LO signal by the factor N. In an embodiment, clock signals 312a and 312b are single-ended signals. In another embodiment, clock signals 312a and 312b are fully differential clock signals, so that clock signals 312a and 312b include a differential pair of N*LO+ and N*LO− signals, where when N*LO+ is at logical "1", N*LO− is at logical "0", and vice versa. Switches 310a and 310b can be implemented with MOSFETs that can be p-channel and/or n-channel MOSFETs in an embodiment.

In conventional receivers, the RF signal 307 is downconverted to a baseband signal by using a square-wave LO signal. The square-wave LO signal downconverts any RF signal at N*LO to the same baseband frequency at which the baseband signal is located. These unwanted signals at harmonics of the LO signal corrupt the wanted RF signal 307 after downconversion to the baseband signal. Embodiments of the present invention can suppress these harmonics where the conventional mixers cannot.

Sampled signals 314a and 314b are provided to a second switching stage 320. If amplifier 305 is a voltage amplifier, signals 314a and 314b are provided to the second switching stage as voltages. If amplifier 305 is a trans-conductance amplifier, signals 314a and 314b are provided to the second switching stage as currents. In an embodiment, second switching stage 320 includes a first bank of switches 320a and a second bank of switches 320b. Sampled signal 314a is provided to the first bank of switches 320a. The first bank of switches 320a includes a number of switches 320a-1, 320a-3, . . . , 320a-N that are connected in parallel; each one of the switches 320a-1, 320a-3, . . . , 320a-N is controlled by a respective clock signal LO_1, LO-3, . . . , LO-N to generate a frequency translated output signal. In an embodiment, the LO clock signal has a frequency that is substantially equal to the RF signal frequency so that the frequency translated output signal is a baseband signal or a near-zero intermediate frequency (IF) signal (hereinafter referred as baseband signal BB_x, with x=0, . . . , N). Similarly, sampled signal 314b is provided to second bank of switches 320b. Second bank of switches 320b includes a number of switches 320b-0, 320b-2, . . . , 320b-(N−1) that are connected in parallel; each one of the switches 320b-0, 320b-2, . . . , 320b-(N−1) is controlled by a respective clock signal LO_0, LO-2, . . . , LO-(N−1) to generate a frequency translated baseband signal BB_0, BB_2, . . . , BB_(N−1). In the exemplary embodiment shown in FIG. 3A, the number of switches in the first and second banks of switches of second switching stage 320 is equal to 8, so that the RF signal is oversampled with an 8×LO (N=8) sampling frequency. It is understood, however, that more or fewer switches may be used in each bank.

In an embodiment, each of the frequency translated baseband signals BB_0, BB_1, BB_2, . . . , BB_(N−1), BB_N are weighted (or scaled) using a corresponding weighting component 330__x that is associated with each LO_x (x=0 to N) clock signal. In the example shown in FIG. 3A, the frequency translated baseband outputs of the first bank of switches 320a are weighted (scaled) with their corresponding weighting components that are associated with clock signals LO_1, LO_3, . . . , LO_N. The weighted baseband signals 340_1, 340_3, . . . , 340_N are then summed together or combined in a combiner 350 to produce an in-phase baseband output signal 360a. Similarly, the frequency translated baseband outputs of the second bank of switches 320b are weighted (scaled) using their corresponding weighting components 330__x (x=0, 2, . . . , N−1) that are associated with clock signals LO_0, LO_2, . . . , LO_(N−1). The weighted baseband signals 340_0, 340_2, . . . , 340 (N−1) are then summed together or combined in combiner 350 to produce a quadrature baseband output signal 360b.

It is noted that the weighting components can be disposed in front of each of the switches 320__x instead of after the switches 320__x (as indicated by the dotted arrow) without affecting the harmonic rejecting performance of mixer 300A. In an example embodiment, amplifier 305 is a trans-conductance amplifier that converts the voltage-domain RF input signal 301 to a current value, so that mixer 300A operates in a current domain and the weighting components 330__x can be implemented as resistors. The combiner 360a and 360b can be current adders that are known in the art and will not be described herein for the sake of brevity. In another example embodiment, amplifier 305 is a voltage amplifier that amplifies the voltage amplitude of RF input signal 301, so that mixer 300A operates in a voltage domain and the weighting components can be implemented as resistors switched as voltage dividers.

Figure 3B:
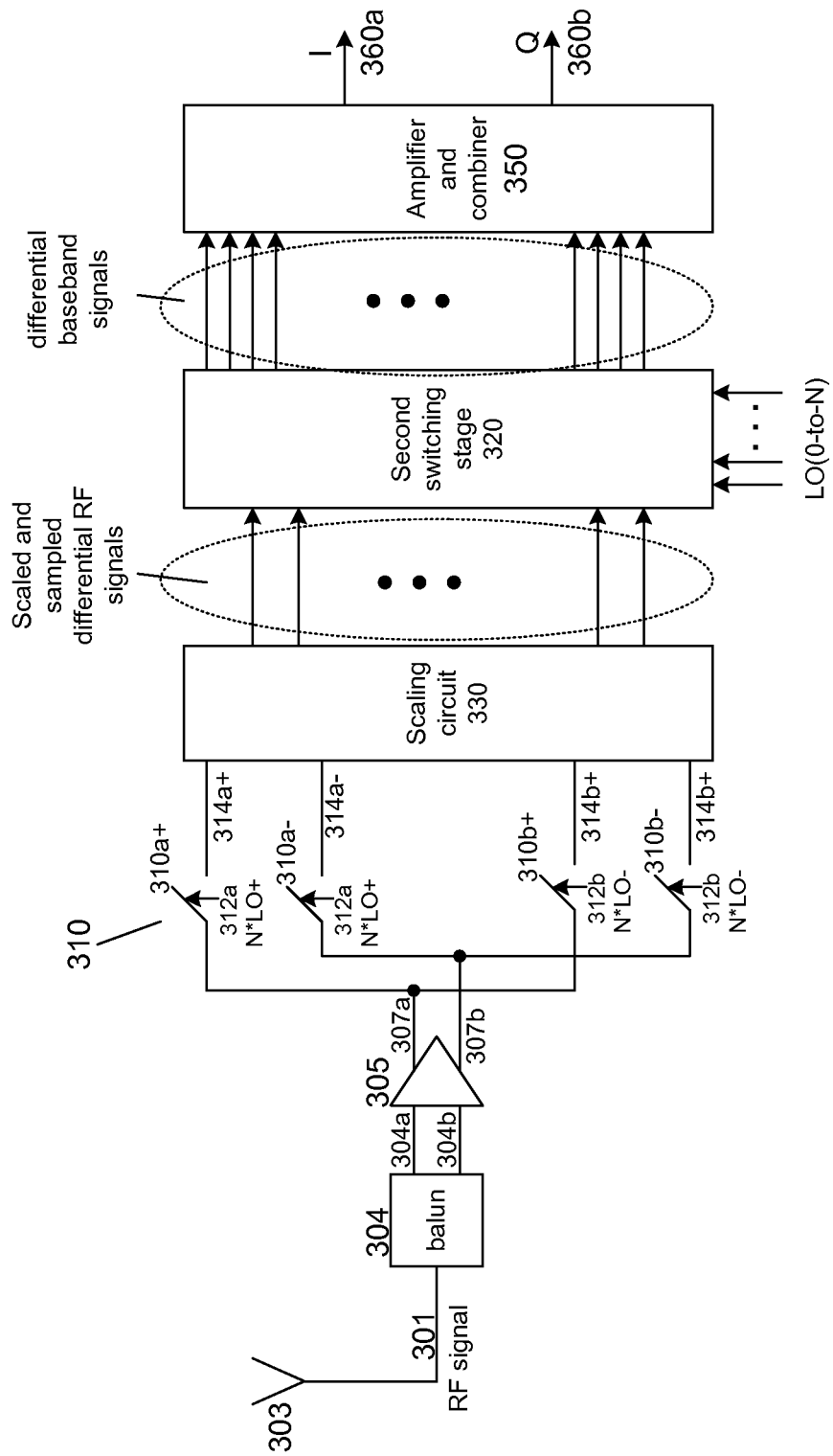
FIG. 3B is a simplified block diagram of a portion of FIG. 3A illustrating differential signals according to an embodiment of the present invention.

Although in FIG. 3A, the signals are shown as single-ended signals, it is understood that these signals may be differential signals in embodiments of the present invention. In some embodiments, the RF signal 301 can be converted to a differential signal using a balun (balance-to-unbalanced) circuit 304 disposed between antenna 303 and amplifier 305, as shown in FIG. 3B. In an embodiment, amplifier 305 can be a differential voltage amplifier. In another embodiment, LNA 305 can be a differential trans-conductance amplifier having a Gm gain that converts the voltage amplitude of signals 304a and 304b (i.e., the differential signals of RF signal 301) into corresponding current values 307a and 307b. Amplified differential RF signals 307a and 307b are then provided to first switch 310a and second switch 310b of first switching stage 310, respectively. First switch 310a includes two switches 310a+, 310a− connected in parallel; each one of the parallel switches receives a respective value 307a, 307b and is controlled by a clock signal 312a. Similarly, second switching element 310b includes two switches 310b+ and 310b− connected in parallel; each one of the parallel switches receives a respective value 307a, 307b and is controlled by a clock signal 312b. In an embodiment, clock signal 312a includes a number of true signals N*LO+ and 312b includes a number of complement signals N*LO−. The true and complement signals N*LO+ and N*LO− are differential clock signals having an N times the frequency of an LO signal. The N*LO+ and N*LO− differential signals may be generated by a phase locked loop having a reference clock LO in a specific embodiment. Each of the true signals 312a and complement signals 312b has a 50% duty cycle. The true and complement signals do not overlap.

Clock 312a turns on and off switch 310a to sample differential RF signal 307a, 307b so as to generate a set of sampled signals 314a+, 314a−. In an embodiment, the sampled differential signals 314a+, 314a− are provided to a scaling circuit 330 having a plurality of weighting components connected in parallel. The scaling circuit thus generates a plurality of parallel scaled RF signals that is fed to a first portion 320a of a second switching stage 320. Similarly, clock 312b turns on and off switch 310b to sample differential RF signal 307a, 307b so as to generate a set of sampled signals 314b+, 314b−. The sampled signals 314b+, 314b− are provided to the scaling circuit 330 that may have a plurality of weighting components connected in parallel. The scaling circuit thus generates a plurality of parallel scaled RF signals that is fed to a second portion 320b of a second switching staging 320. Second switching staging 320 guides the scaled RF signals to different outputs using a second plurality of switching signals including control signals LO_x (x=0 to N).

In an alternative embodiment, sampled differential RF signals 314a+, 314a−, and 314b+, 314b− are first provided to the second switching stage 320 that mixes each of the sampled differential RF signals with one of the control signal LO_x to frequency translate the sampled RF signals to differential baseband signals BB_x. The differential baseband signals BB_x are then weighted (scaled) by the scaling circuit 330.

In an embodiment, control signals LO_0, LO_2, . . . , LO_(N−1) are non-overlapping and are phase shifted in relation to each other, and control signals LO_1, LO_3, . . . , LO_N are non-overlapping and are phase shifted in relation to each other. Control signals LO_x (x=0 to N) can be generated from the N*LO clock signal using delay elements (e.g., flip-flops) and logic gates such as NAND, NOR, XOR, and the like, as known in the art. The N*LO clock signal is a 50% duty cycle signal, and each of the clock signals LO_x (x=1 to N) has a duty cycle that is substantially equal to the period of the N*LO signal. In an embodiment, the odd-number indexed control signals such as LO_1, LO_3, LO_5, etc. are non-overlapping and have a positive (logical state "1") pulse that completely covers (overlaps) one positive pulse of the N*LO clock signal.

Figure 3C:
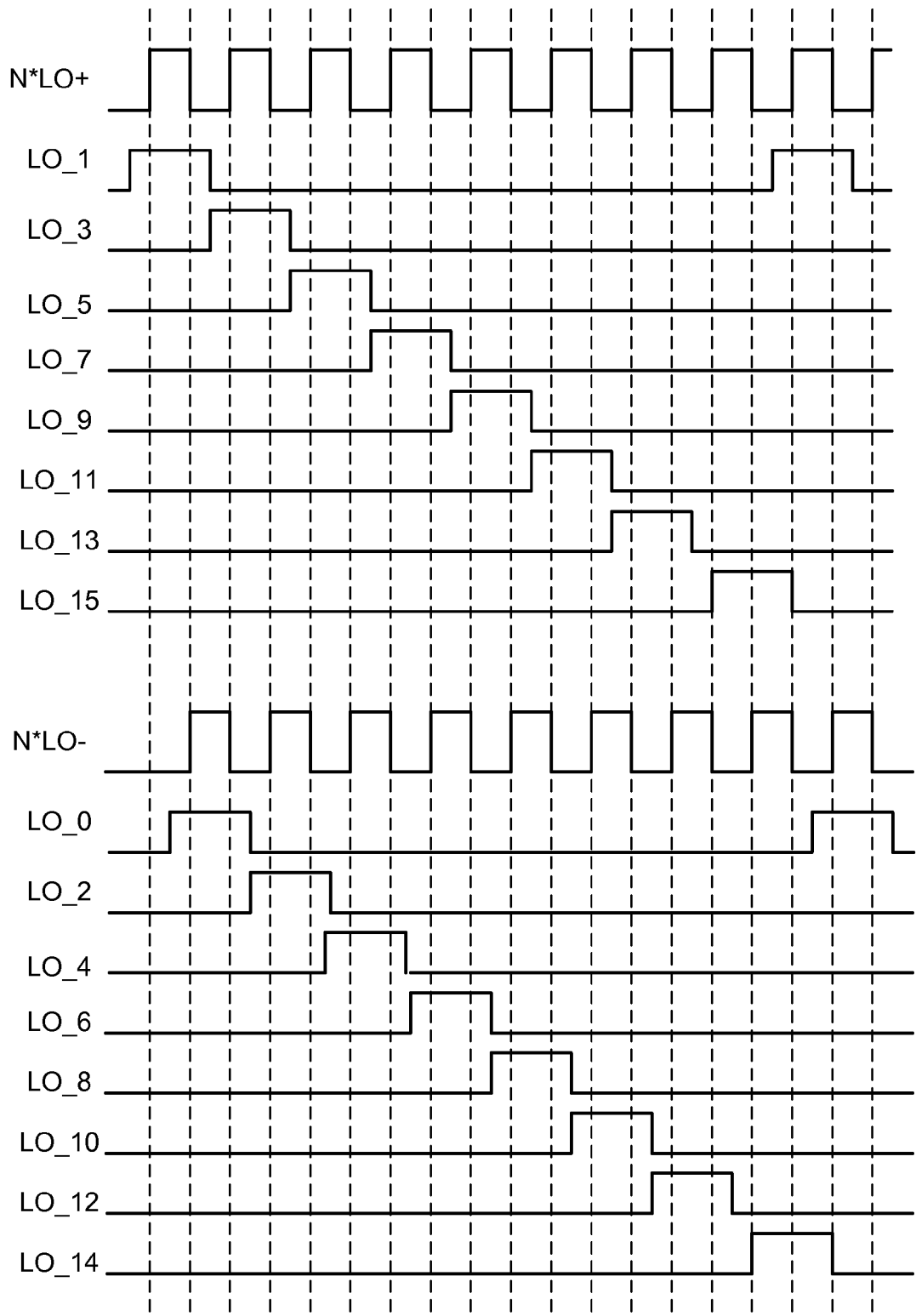
FIG. 3C is a timing diagram of the LO signals used in embodiments of the present inventions.

FIG. 3C is a timing diagram of the LO signals used in FIGS. 3A and 3B. The N*LO clock signal is a differential signal having a frequency that is N times the frequency of the LO signal. The N*LO differential signal have a 50% duty cycle and include a number of true signals N*LO+ and a number of complement signals N*LO−. The true and complement signals are phase shifted with respect to one another and do not overlap with one another. The LO signals include a multitude of odd-number indexed control signals LO_1, LO_3, etc. and a multitude of even-number indexed signals. The LO_x (x=0 to N) control signals for the second switching stage have an asymmetric duty cycle. In an exemplary embodiment, the LO_x control signals have a positive (logical "1" state) pulse that is substantially equal to the period of the N*LO clock signal. In other words, if the LO_x control signals have a period duration equal to N times the period duration of the N*LO signal, then the LO_x control signals have a duty cycle that is equal to 1/N of the period duration of the LO_x control signals. In an embodiment, each one of the LO_x control signals completely covers (overlaps) at least one positive pulse of the N*LO signal. In the example shown in FIG. 3A, the second switching stage 320 has two banks of switches, each bank including eight (8) switches connected in parallel (i.e., N=8). As shown in FIG. 3C, each of the LO_x control signal has a period duration that is equal to 8 times the period duration of either the N*LO+ or N*LO− signal and a duty cycle equal to 1/N (⅛=0.125).

Figure 4A:
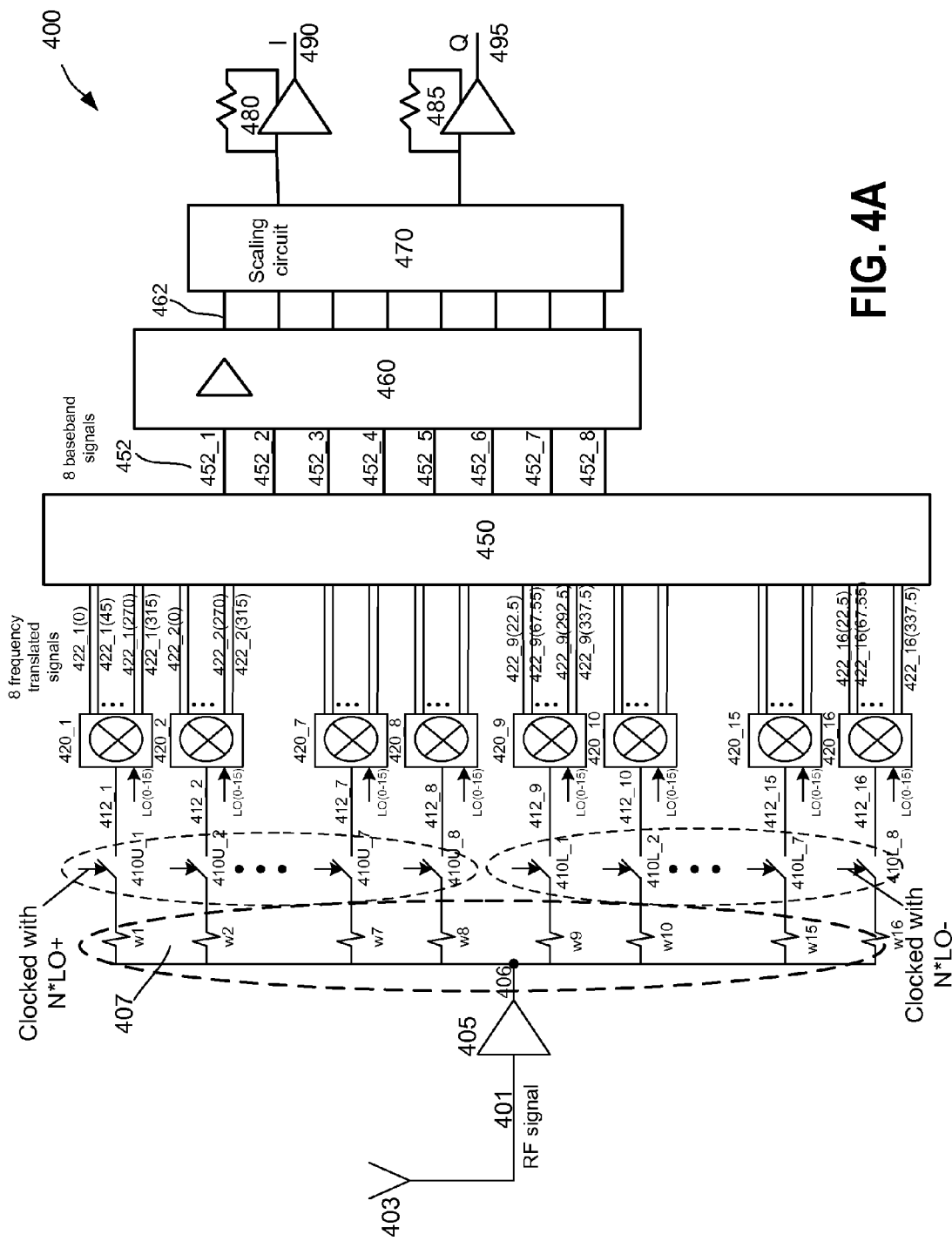
FIG. 4A is a schematic diagram of a harmonic rejection mixer having a dual harmonic rejection topology according to an embodiment of the present invention.

FIG. 4A is a simplified block diagram of an exemplary harmonic reject mixer 400, in accordance with another embodiment of the present invention. This block diagram is merely an example, which should not unduly limit the scope of the claims herein. One of ordinary skill in the art would recognize other variations, modifications, and alternatives. Harmonic reject mixer 400 includes an amplifier 405 coupled to an antenna 403 for receiving an RF signal 401. In an embodiment, amplifier 405 can be a low noise trans-impedance amplifier that amplifies a voltage amplitude of RF signal 401. In another embodiment, amplifier 403 can be a trans-conductance amplifier having a Gm stage to convert the voltage of the RF signal to a current-domain RF signal. The amplified RF signal 406 is provided to a first switching stage 410. In an exemplary embodiment, first switching stage 410 is shown as including 8 switches 410U_1, . . . , 410U_8 disposed in the upper half 410U of the first switching stage, and 8 switches 410L_1, . . . , 410L_8 disposed in the lower half 410L of the first switching stage. It is understood that the number of switches in the first switching stage can be any integer number N. In the example shown in FIG. 4A, eight switches are used in the upper and lower portions of the first switching stage. But it is understood that the number is arbitrarily chosen for describing the example embodiment and should not be limiting. The output 412_i (i=1 to 16) of each switch in the first switching stage 410 is applied to a corresponding mixing bank 420_j, where j is an index ranging from 1 to 16 for this exemplary embodiment. For example, the output 412_1 of switch 410_1 is applied to mixing bank 420_1 and the output of switch 412U_2 is applied to mixing bank 420_2, and so forth. Each mixing bank 420_j includes a number of switches in one embodiment. The switches in each mixing bank 420 are similar to those shown in the second switching stage 320 of FIG. 3A. Similar to switches in the second switching stage 320, switches in each mixing bank 420 can be implemented with p-channel or n-channel MOS transistors, MOS transfer gates, field effect transistors (FETs) in a specific embodiment.

Each mixing bank 420_j generates 8 outputs with the same weighting factor wj, the 8 outputs are phase shifted with respect to one another. In a specific embodiment, where the amplifier 405 is a trans-conductance amplifier, the weighting factors can be determined by the value of the resistors disposed at the input of the first switching stage 410 that includes 410U and 410L. In another embodiment, the weighting factors can be determined by the value of the resistors that are disposed at the output of the first switching stage 410. Furthermore, the 8 outputs of each mixing bank 420_j have different weighting factors relative to the corresponding outputs of each of the other mixing bank. The outputs of these mixer banks can be combined in a combiner 450 in the current domain by selecting one phase from the first mixer bank, a second phase from the second mixer bank, a third phase from the third mixer bank, and so forth, in a specific embodiment. This results in multiple phases of signals that have one layer of harmonic rejection.

Figure 4B:
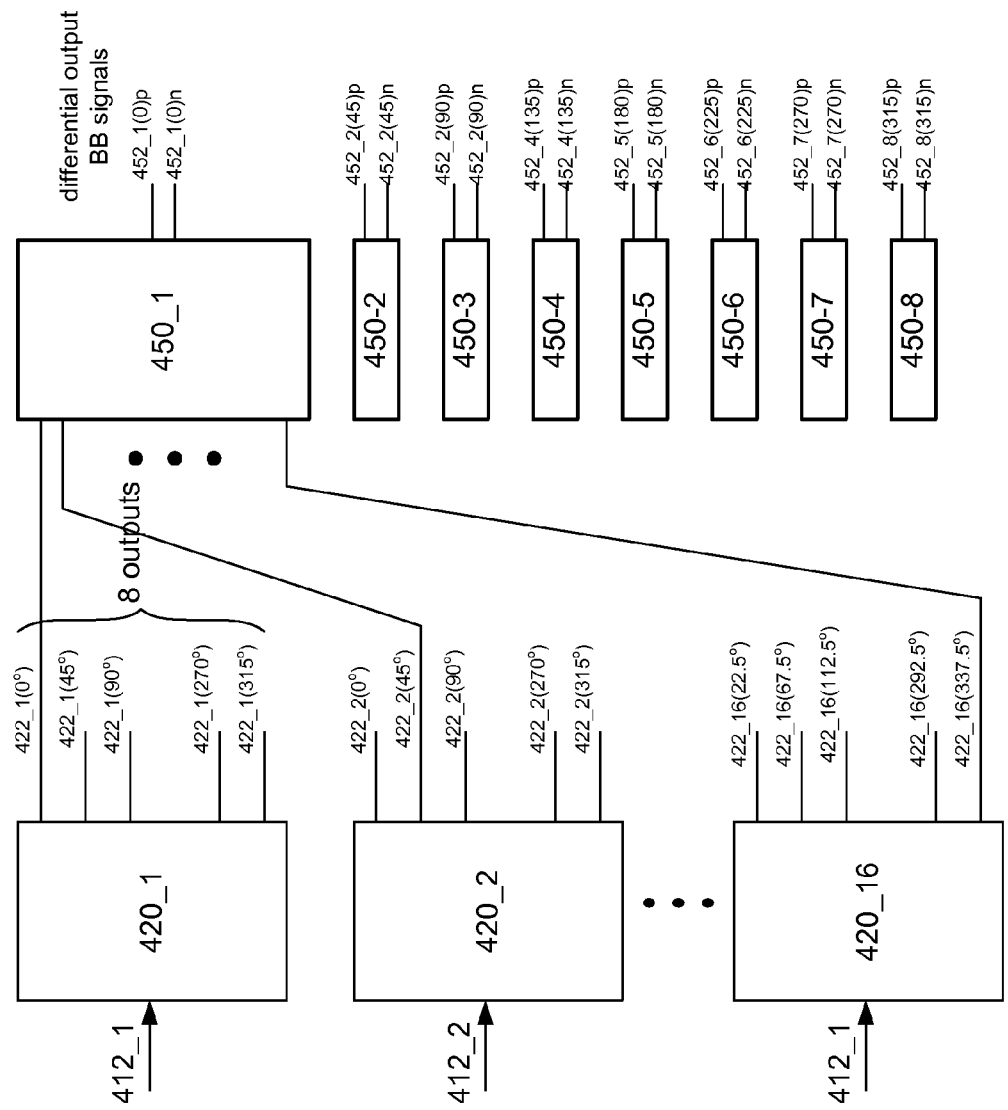
FIG. 4B shows more details of a portion of the harmonic rejection mixer of FIG. 4A.

FIG. 4B shows more details of the one layer harmonic rejection mixer of FIG. 4A. As shown, mixing bank 420_1 receives a weighted RF signal 412_1 that is scaled with weighting component w1 and generates 8 outputs; each of the outputs having a different phase with respect to one another. In the exemplary embodiment, the outputs are indexed as 422_1(0°), 422_1(45°), 422_1(90°), 422_1(135°), 422_1(180°), 422_1(225°), 422_1(270°) and 422_1(315°). Similarly, mixing bank 420_2 receives a weighted RF 412_2 that is scaled with weighting component w2 and generates 8 outputs 422_2(0°), 422_2(45°) . . . , 422_1(315°) and 422_1 (337.5°). Likewise, mixing bank 420_9 receives a weighted RF 412_9 that is scaled with weighting component w9 and generates 8 outputs 422_9(22.5°), 422_9(67.5°), . . . , 422_9 (292.5°) and 422_9(337.5°). Mixing bank 420_16 receives a weighted RF 412_16 that is scaled with weighting component w16 and generates 8 outputs 422_16(22.5°), 422_16(67.5°), . . . , 422_16(292.5°) and 422_16(337.5°). In an embodiment, each of the 8 outputs 422_n (n=1 to 16) of each mixing bank 420_n is a single-ended output signal. In a specific embodiment, each of the 8 outputs 422_n (n=1 to 16) of each mixing bank 420_n is a differential output signal.

In an embodiment, combiner 450 may include 8 individual combiner 450_i (i=0 to 7) having eight input terminals, each of which receives one frequency translated output of the 16 mixing banks 420_n and outputs a different baseband signals. In an embodiment, each of the eight input terminals is configured to receive one of the differential output signals of the associated mixing bank. Each of the eight individual combiner 450_n receives 8 baseband signals from the corresponding mixing banks and generates a combined baseband output signal 452_i that eliminates all harmonics except those at (m*2N)+1 and (m*2N)−1. In a specific embodiment, each of the combined baseband output signal is a differential signal that is shown as having 452_i(phase_i)p and 452_i (phase_i)n, where phase_i is the i-th phase associated with the i-th combiner output and index p is the true output signal and index n is the complement output signal of the i-th combiner output differential signal. In the exemplary embodiment, the phase_i may be one of the phases 0°, 45°, 90°, 135°, 180°, 225°, 270°, or 315°.

In an embodiment, the 8 combined baseband signals 452_i (i=1 to 8) may be current signals that are then provided to an amplifier block 460. In an embodiment, amplifier 460 may be an current-voltage converter that convert the received current signals to corresponding voltage values.

Referring back to FIG. 4A, the baseband signals 452-n can be in the current domain and weighted using resistors disposed in a scaling circuit block 470 that includes a number of resistive elements whose value corresponds to a desired weighting factor. The weighted baseband signals are than provided to baseband amplifiers 480 and 485 that generate an in-phase baseband signal 490 and a quadrature baseband signal 495. In a specific embodiment, harmonic reject mixer has an amplifier 460 interposed between combiner 450 and scaling circuit 470. Amplifier 460 is a current-voltage converter that converts the received current signals 452_n to corresponding voltage values 462_n. In an embodiment, amplifiers 480 and 485 are operational amplifiers that combine the weighted baseband signals in the current domain. It is noted that baseband amplifiers are differential amplifiers operable in the voltage mode or in the current mode depending on the application. Such amplifiers are known to those skilled in the art and details of the amplifiers are thus omitted for the sake of brevity.

In an embodiment, the RF signal is a single-ended signal that is provided to the first weighting components 407. The first switching stage comprises a first plurality of switches that can be implemented using any switching technology. The second switching stage comprises a plurality of mixing (or switching) banks, each mixing bank comprises a second plurality of switches that can be implemented using any switching technology. Combiner 450 comprises a plurality of individual combiners that adds together the different weighted frequency translated RF signals having different phase shifts to generate a first plurality of baseband signals. In an embodiment, the first plurality of baseband signals includes differential signals. The first plurality of differential baseband signals is provided to a plurality of baseband amplifiers 460 to generate a second plurality of baseband signals that can be differential signals in a specific embodiment.

Accordingly, as described above, in such embodiments, each input to the baseband amplifier and combiner 350 is received from the outputs of the second mixing stage, each of the outputs is phase shifted in relation to one another. First order phase errors are eliminated by the dual switch configuration shown in FIGS. 3A and 3B. FIG. 3C is a timing diagram of the LO signals used in FIGS. 3A and 3B. Harmonic rejection limitation due to amplitude errors in the RF splitter and amplitude errors in the base-band resistive recombination bank are mitigated by the two-stage dual-harmonic rejection mixer—the first stage of harmonic rejection occurs at the mixing stage output and the second stage harmonic rejection occurs at the combiner outputs after a recombination of the base-band signals.

Figure 5:
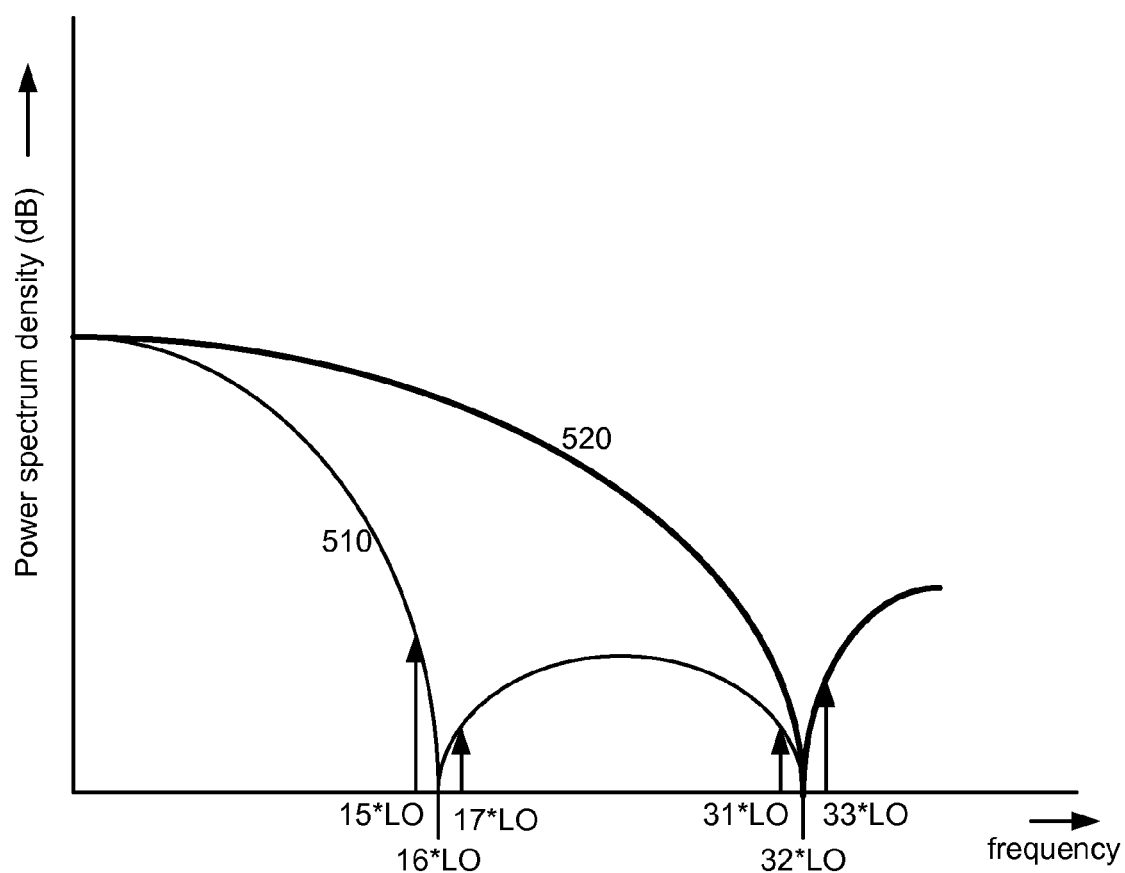
FIG. 5 shows frequency responses of the dual harmonic rejection mixer of FIG. 4A.

As shown in FIG. 5 for N=16 (RF signal being oversampled by N) and 8 baseband amplifiers, harmonics other than $15^{th}$, $17^{th}$ and $31^{st}$ are eliminated through the dual harmonic rejection implemented as a two switching stage mixer. Specifically, $15^{th}$ and $17^{th}$ harmonics are reduced in level after the two switching stage mixer whose frequency response is indicated as roll off 510 having zero at 16*LO in FIG. 5.

Figure 6A:
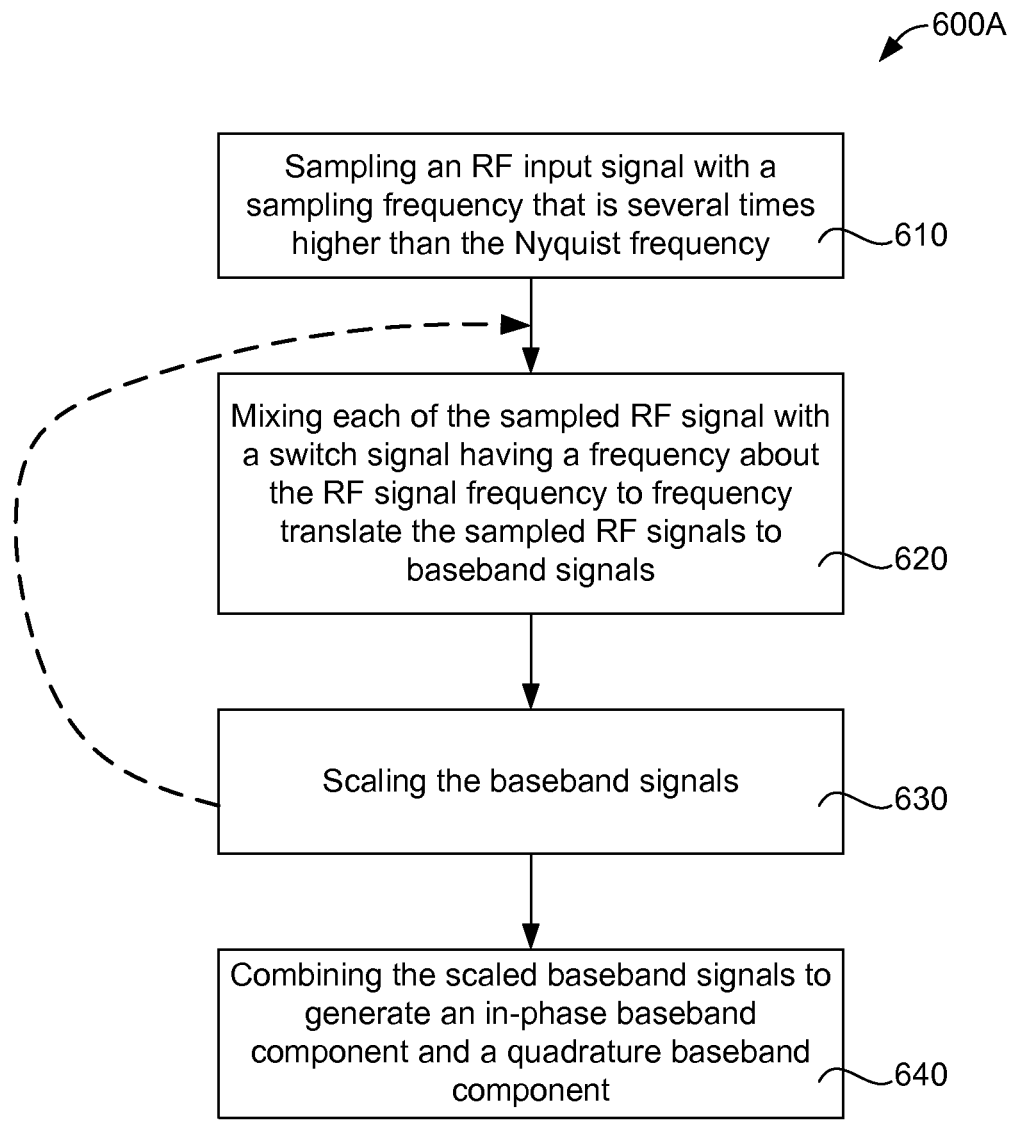
FIG. 6A is a simplified flowchart of a method of performing harmonic rejection according to an embodiment of the present invention.

FIG. 6A is a simplified flowchart of a method 600A describing the operation of an embodiment of a harmonic rejection mixer using a two-switching stage architecture according to an embodiment of the present invention. The method 600 will be described together with blocks shown in FIGS. 3A and 3B. As described in above sections in connection with FIGS. 3A, 3B, and 3C, the blocks can be performed in the order or out of the order shown in FIG. 6.

In block 610, an RF signal is received and amplified (e.g., amplifier 305 in FIG. 3A) by the two-switching stage mixer. The first switching stage 310 samples the amplified RF signal with an N*LO clock signal to generate a multitude of sampled RF signals. The N*LO clock frequency is several times higher than the frequency of the RF signal. In block 620, the sampled RF signals are frequency translated to N parallel baseband signals by mixing (multiplying) with N parallel switches in a second switching stage (320), wherein each of the parallel switches is controlled by a phase-shifted version of an LO signal (see FIG. 3C). In block 630, the N baseband signals are scaled by N weighting factors whose values are associated with the corresponding phase of the LO signal. The scaled baseband signals are then combined to generate a baseband signal that is free of all harmonics except the m*2N±1 harmonics, where m is an integer. In an alternative operation flow, block 630 may be performed prior to block 620 (indicated as dotted arrow). In this case, the sampled RF signals are demultiplexed to N parallel RF signals and each of the demultiplexed RF signals is then scaled with a corresponding weighting factor in block 630. The N scaled RF signals are then switched in the second switching stage by N phase-shifted LO signals to generate N corresponding parallel baseband signals in block 620 that follows block 630. The baseband signals are then combined in block 640 to generate a composite baseband signal that eliminates all harmonics except those at m*2N±1, where m is an integer.

Figure 6B:
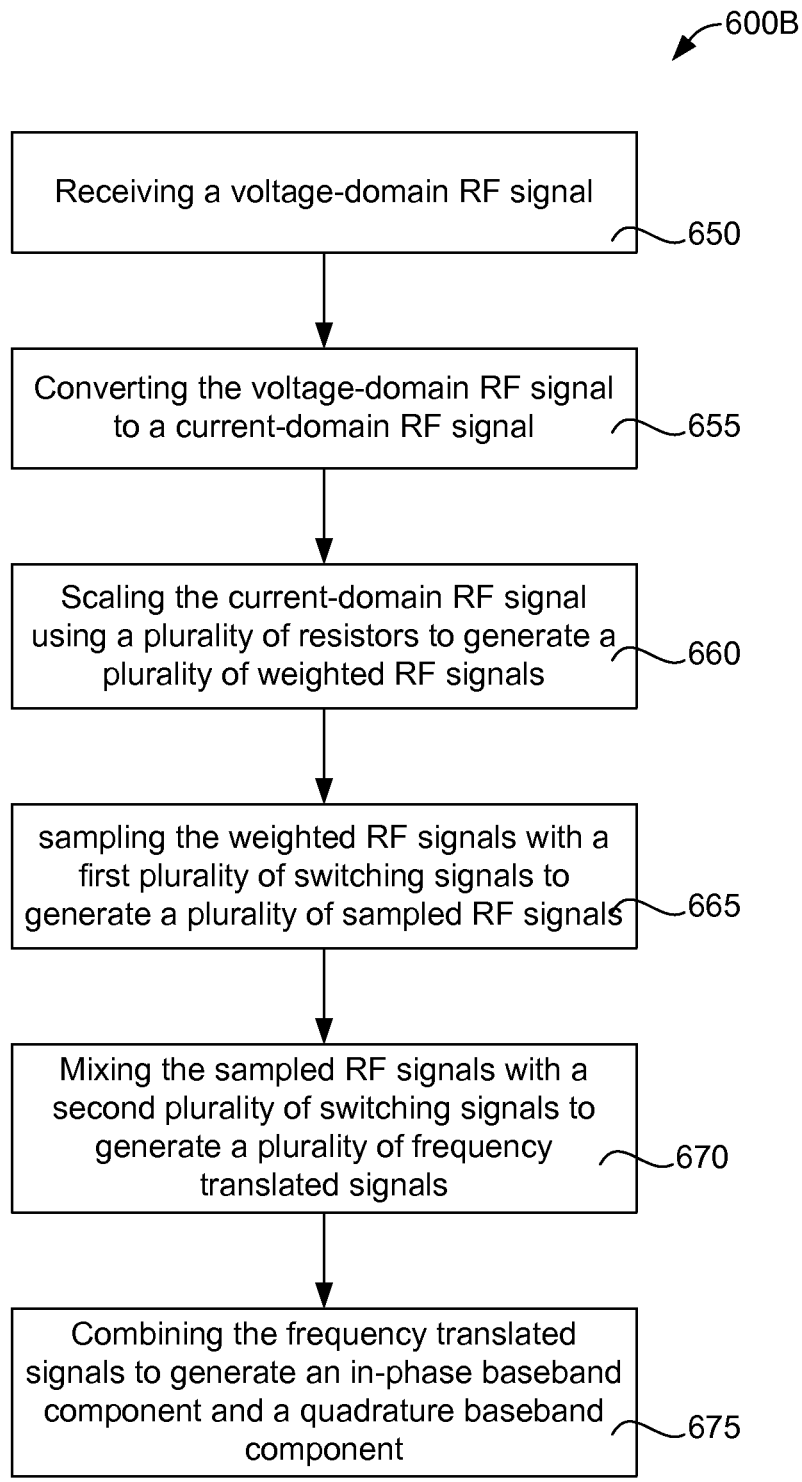
FIG. 6B is a simplified flowchart of a method of performing harmonic rejection according to another embodiment of the present invention.

FIG. 6B is a simplified flowchart of a method 600B of performing harmonic rejection according to an embodiment of the present invention. Method 600B starts with block 650 for receiving a voltage-domain RF signal. Block 655 converts the voltage domain RF signal to a corresponding current value of the RF signal. Block 660 scales the current-domain RF signal with a plurality of weighting factors to generate a plurality of weighted RF signals. The weighting factors can be implemented using resistive elements in an embodiment. The weighted RF signals are sampled in block 665 with a first plurality of switching signals to generate a plurality of sampled RF signals. The first switching signals have a frequency that is several time higher than the frequency of the RF signal. The sampled RF signals are provided to block 670 that mixes the sampled RF signals with a second plurality of switching signals to generate a plurality of frequency translated signals. In an embodiment, the second switching signals include a frequency that is substantially equal to the RF signal frequency so that the frequency translated signals are baseband signals. The second switching signals are phase-shifted versions of a same local oscillator signal. In block 675, the frequency translated signals are then combined in a dual baseband amplifier to generate an in-phase baseband component and a quadrature baseband component.

Figure 7:
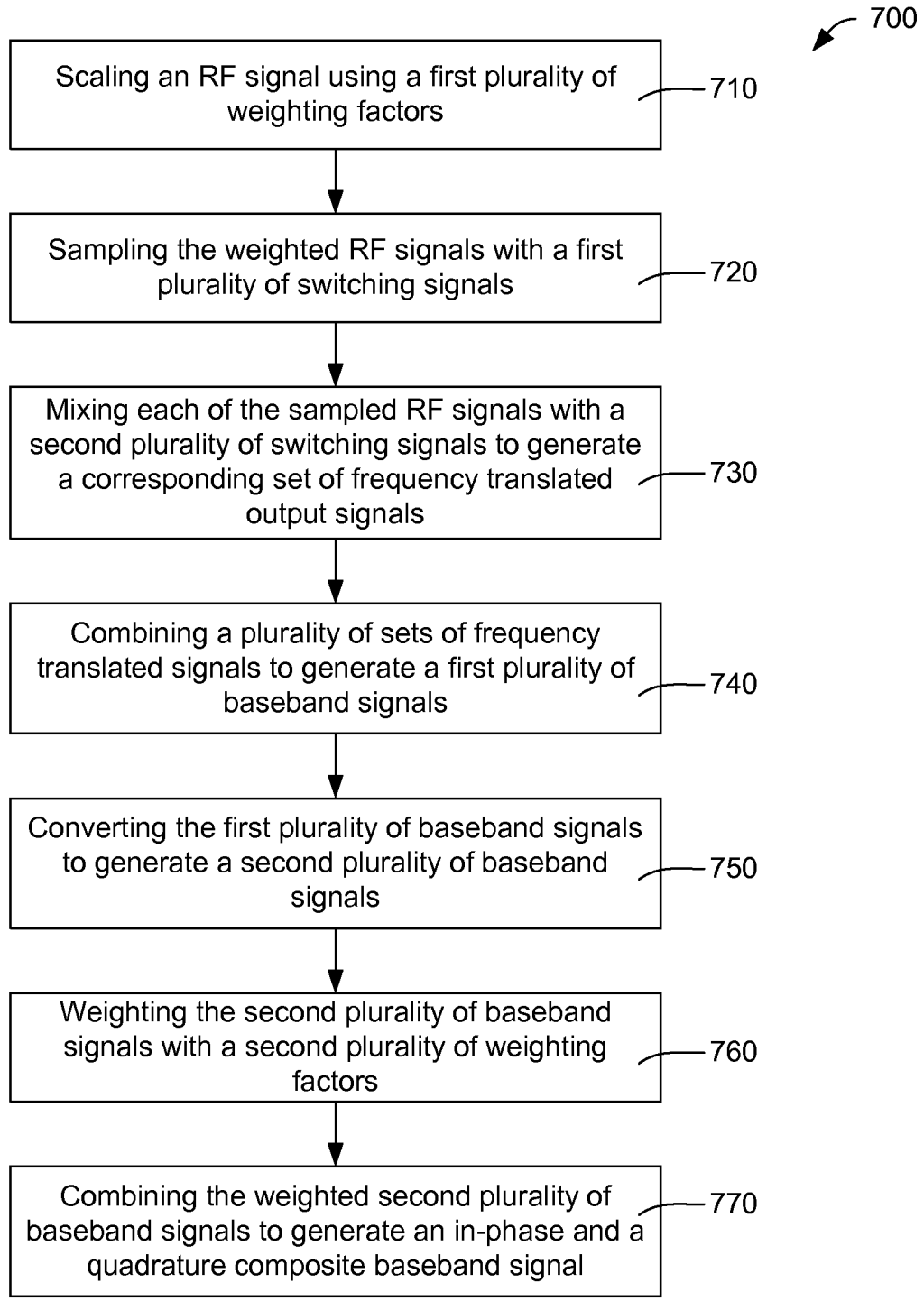
FIG. 7 is a simplified flowchart illustrating a method of rejecting harmonics in a mixer according to yet another embodiment of the present invention.

FIG. 7 is a simplified flowchart of an embodiment of a method 700 of rejecting harmonics in a mixer. The method 700 includes scaling a received and amplified RF signal using a plurality of weighting factors in block 710. In an embodiment, the RF signal can be amplified using a trans-conductance amplifier to convert the amplitude of the received RF signal into a corresponding current value and the scaling can be performed using resistors having appropriate values in the current domain. The weighted RF signals are then proceeded to block 720 where they are sampled by a first plurality of switching signals. As shown in an example embodiment of FIG. 4A, the weighted RF signals are provided to a first switching stage that may include an upper switching portion and a lower switching portion. The upper switching portion is clocked by an N*LO+ clock signal, and the lower switching portion is clocked by an N*LO− clock signal, where N corresponds to the number of the weighting factors. Thus, each of the weighted RF signals is oversampled either by N*LO+ or by N*LO− clock signals. In an embodiment, the N*LO+ and N*LO− signals are parts of a fully differential N*LO signal. The N*LO signal can be generated using a phase locked loop as shown in FIG. 3A. The N weighted RF samples are then provided to the second switching stage 420, as shown in FIG. 4A, where each of the N weighted RF samples having the same weight is mixed with one of the mixer banks (420_x) in the second switching stage 420. Each of the mixer banks in the second switching stage includes a plurality of mixers that are controlled by a plurality of phase-shifted LO control signals to generate a set of frequency translated signals in block 730. By choosing an LO signal that is equal or close to the RF signal frequency, the frequency translated signals will be baseband versions of the weighted RF signals. In block 740, the sets of baseband signals are combined to produce a first plurality of baseband signals that are free of m*2N±1 harmonics, where m is an integer. The first plurality of baseband signals is converted (by converter 460 in FIG. 4A) to generate a second plurality of baseband signals in block 750. As described above in connection with FIGS. 4A and 4B, block 750 is used to convert the current values of the baseband signals to voltage values. Block 750 (i.e., converter 460) may be optional. The second plurality of baseband signals are free of m*2N±1 harmonics, wherein N is 8 in the exemplary embodiment of FIG. 4 (combiner 450 has 8 individual combiners). The method then proceeds to block 760 and scales the second plurality of baseband signals with a second plurality of weighting factors (470 in FIG. 4). The weighted second plurality of baseband signals are combined in amplifiers 480, 485 to generate an in-phase composite baseband signal 490 and a quadrature composite baseband signal 495.

The mixer can be produced on a single IC. Such an implementation allows the various elements to be better matched than is possible using discrete elements or multiple ICs. The ability to closely match the elements of the mixer can reduce the level of amplitude and phase errors.

The steps of a method described in connection with the embodiments disclosed herein may be embodied directly in hardware, in a software module executed by a processor, or in a combination of the two. The various steps or blocks may be performed in the order shown, or may be performed in another order. Additionally, one or more steps or blocks may be omitted or added in the beginning, end, or intervening existing elements of the methods.

The above embodiments of the present invention are illustrative and not limitative. Various alternatives and equivalents are possible. The invention is not limited by the switches, mixers, amplifiers, resistors, etc. used. The invention is not limited by the number of switches disposed in each switching stage. Nor is the invention limited by the type or the frequency of the LO signal. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A radio frequency (RF) mixer for transforming a frequency of an RF input signal, the RF mixer comprising:
    a first switching stage having a first plurality of switches configured to sample the RF input signal to produce a sampled RF signal in response to a first plurality of switching signals; and
    a second switching stage having a second plurality of switches connected in parallel, the second plurality of switches being configured to receive the sampled RF signal and produce a plurality of frequency translated output signals in response to a second plurality of switching signals;

wherein each of the second plurality of switching signals is a phase-shifted version of a local oscillator (LO) signal having a LO frequency, the LO frequency being substantially equal to a frequency of the RF signal, wherein the first plurality of switching signals have a frequency N times higher than the LO frequency, N being an integer greater than unity.

2. The RF mixer of claim 1, wherein the first plurality of switching signals comprises a plurality of true signals and a plurality of complement signals, wherein the true and complement signals do not overlap; wherein the plurality of second switching signals comprises a plurality of parallel signals, wherein the parallel signals comprise asymmetric duty cycles, wherein each of the first plurality of true and complement signals has a 50% duty cycle.

3. The RF mixer of claim 2, wherein the first switching stage comprises:
a first switch controlled by the set of direct signals and configured to generate a first portion of the sampled RF signal; and
a second switch controlled by the inverted signal and configured to generate a second portion of the sampled RF signal.

4. The RF mixer of claim 3, wherein the RF input signal is a single-ended signal that is coupled to the first and second switches.

5. The RF mixer of claim 3, wherein the RF input signal is a differential signal comprising a direct RF signal and an inverted RF signal, the direct RF signal being coupled to the first switch and the inverted RF signal being coupled to the second switch.

6. The RF mixer of claim 3, wherein the second switching stage comprises:
a first bank of switches configured to mix the first portion of the sampled RF signal with a first portion of the second plurality of switching signals and generate a first portion of the frequency translated output signals; and
a second bank of switches configured to mix the second portion of the sampled RF signals with a first portion of the second plurality of switching signals and generate a second portion of the frequency translated output signals.

7. The RF mixer of claim 2, wherein one of the parallel signals completely covers one of the set of direct signals or one of the set of inverted signals.

8. The RF mixer of claim 1 further comprising a plurality of scaling elements, wherein the scaling elements are configured to scale the frequency translated output signals.

9. The RF mixer of claim 8 further comprising a combiner configured to combine the scaled frequency translated output signals to produce an in-phase baseband composite signal and a quadrature baseband composite signal.

10. A harmonic rejection mixer comprising:
a first scaling circuit having a first plurality of weighting factors and configured to scale an amplitude of an RF signal using the weighting factors and generate a plurality of scaled RF signals;
a first switching stage having a plurality of first switches connected in parallel and configured to sample the plurality of scaled RF signals and generate a plurality of sampled RF signals in response to a first plurality of switching signals; and
a second mixing stage having a plurality of second switches connected in parallel and configured to mix the plurality of sampled RF signals and generate a plurality of frequency translated output signals in response to a second plurality of switching signals.

11. The harmonic rejection mixer of claim 10, wherein the first plurality of switching signals is a 50% duty cycle signal comprising a set of direct signals and a set of inverted signals, wherein the direct and inverted signals do not overlap.

12. The harmonic rejection mixer of claim 11, wherein the first switching stage comprises:
a first bank of switches controlled by the set of direct signals; and
a second bank of switches controlled by the set of inverted signals.

13. The harmonic rejection mixer of claim 10, wherein the plurality of second switching signals comprises a plurality of phase-shifted versions of a same local oscillator (LO) signal having a period substantially equal to N times a period of a first switching signal and a duty cycle substantially equal to the period of the first switching signal, N being an integer greater than unity.

14. The harmonic rejection mixer of claim 13, wherein the LO signal comprises a frequency substantially equal to a frequency of the RF signal.

15. The harmonic rejection mixer of claim 10 further comprising a combiner configured to combine the plurality of frequency translated output signals to produce a first plurality of baseband versions of the RF signal.

16. The harmonic rejection mixer of claim 15 further comprising a first amplifier stage configured to receive the plurality of baseband versions and generate a second plurality of baseband versions.

17. The harmonic rejection mixer of claim 16 further comprising a second scaling circuit configured to scale the second plurality of baseband versions using a second plurality weighting factors.

18. The harmonic rejection mixer of claim 17 further comprising a second amplifier stage configured to receive the scaled second plurality of baseband versions and generate an in-phase baseband composite component and a quadrature baseband composite component.

19. The harmonic rejection mixer of claim 18, wherein the RF signal is a single-ended signal and the in-phase and quadrature baseband composite component are differential signals.

20. A method of down-mixing a radio frequency (RF) signal, the method comprising:
sampling the RF signal with a first plurality of switching signals to generate a sampled RF signal; and
mixing the sampled RF signal with a different one of a second plurality of parallel switching signals to produce a plurality of frequency translated output signals;
wherein each of the second plurality of switching signals is a phase-shifted version of a local oscillator (LO) signal having an LO frequency,
wherein a frequency of the first plurality of switching signals is N times higher than the LO frequency, N being an integer greater than unity.

21. The method of claim 20, wherein N is equal to 16.

22. The method of claim 20 further comprising scaling the plurality of frequency translated output signals with a plurality of weighting factors.

23. The method of claim 22 further comprising combining the scaled frequency translated output signals to generate an in-phase baseband signal and a quadrature baseband signal.

24. A method of down-mixing a voltage-domain RF signal having a RF frequency, the method comprising:
    converting the voltage-domain RF signal into a current-domain RF signal;
    scaling the current-domain RF signal using a plurality of resistive elements coupled in parallel to generate a plurality of weighted RF signals, each of the resistive elements representing a weighting factor;
    sampling the weighted RF signals with a first plurality of switching signals to generate a plurality of sampled RF signals;
    mixing the plurality of sampled RF signals with a second plurality of switching signals to generate a plurality of frequency translated signals; and
    combining the plurality of frequency translated signals to generate an in-phase baseband signal and a quadrature baseband signal.

25. The method of claim 24, wherein the first plurality of switching signals comprises a direct switching signal and an inverted switching signal, the direct and inverter switching signal having a frequency N times greater than the RF frequency, N being an integer greater than unity, and the second plurality of switching signals comprises a frequency that is substantially equal the RF frequency.

26. A method of down-mixing a radio frequency (RF) signal, the method comprising:
    scaling the RF signal using a first plurality of weighting factors to generate a plurality of weighted RF signals;
    sampling the plurality of weighted RF signals using a first plurality of switch signals to generate a plurality of sampled RF signals; and
    mixing the plurality of sampled RF signals with a second plurality of switch signals to generate a plurality of frequency translated output signals;
    wherein the second plurality of switch signals comprises a plurality of phase-shifted versions of a local oscillator signal having a frequency that is about a frequency of the RF signal.

27. The method of claim 26 further comprising combining the plurality of frequency translated output signals to generate a plurality of baseband versions of the RF signal.

28. The method of claim 27 further comprising:
    combining the plurality of baseband versions of the RF signal to generate a second plurality of baseband versions;
    weighting the second plurality of baseband versions with a second plurality of weighting factors to generate a plurality of weighted baseband versions; and
    combining the plurality of weighted baseband versions to generate an in-phase baseband signal and a quadrature baseband signal.

* * * * *